(12) United States Patent
Bhowmik et al.

(10) Patent No.: US 6,169,036 B1
(45) Date of Patent: Jan. 2, 2001

(54) METHOD FOR CLEANING VIA OPENINGS IN INTEGRATED CIRCUIT MANUFACTURING

(75) Inventors: Siddhartha Bhowmik, Orlando, FL (US); Joseph William Buckfeller, Allentown, PA (US); G. Craig Clabough; Sailesh Mansinh Merchant, both of Orlando, FL (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/276,034

(22) Filed: Mar. 25, 1999

(51) Int. Cl.[7] .................................................. H01L 21/00
(52) U.S. Cl. ........................... 438/710; 134/1.2; 134/1.3; 204/192.37; 216/39; 216/57; 438/675; 438/706; 438/722; 438/723
(58) Field of Search ...................... 438/690, 706, 438/710, 711, 712, 722, 723, 637, 675, 677; 134/1.2, 1.3; 204/192.32, 192.37, 298.31; 216/17, 18, 39, 56, 57

(56) References Cited

U.S. PATENT DOCUMENTS

| | | | |
|---|---|---|---|
| 4,516,145 | * 5/1985 | Chang et al. | 438/723 X |
| 5,277,985 | 1/1994 | Li et al. | 428/432 |
| 5,451,543 | 9/1995 | Woo et al. | 437/195 |
| 5,468,339 | 11/1995 | Gupta et al. | 216/67 |
| 5,661,083 | 8/1997 | Chen et al. | 438/637 |
| 5,702,981 | 12/1997 | Maniar et al. | 437/192 |
| 5,736,457 | 4/1998 | Zhao | 438/624 |
| 5,783,495 | * 7/1998 | Li et al. | 438/756 X |
| 5,880,030 | 3/1999 | Fang et al. | 438/701 |
| 5,980,979 | * 11/1999 | Rohner | 438/690 X |
| 6,093,654 | * 7/2000 | Koyama | 438/723 X |

* cited by examiner

Primary Examiner—William Powell
(74) Attorney, Agent, or Firm—Allen, Dyer, Doppelt, Milbrath & Gilchrist, P.A.

(57) ABSTRACT

A method is for cleaning via openings during manufacturing of integrated circuits. The method preferably comprises the steps of sputter cleaning the via opening at least once, and exposing the via opening to a reducing atmosphere at least once. The method may include alternatingly repeating the sputter cleaning and exposing steps. The step of sputter cleaning is preferably performed prior to the step of exposing, and a sputter cleaning may be performed after a last step of exposing the via opening to the reducing atmosphere. In one embodiment, the exposed metal portion comprises a metal compound, such as an oxide. Accordingly, the step of sputter cleaning removes at least a portion of the metal oxide, and the step of exposing comprises reducing at least a portion of the metal oxide. The invention is particularly applicable when the metal interconnection layer is a copper, as copper readily oxides at its exposed surface.

32 Claims, 3 Drawing Sheets

METHOD FOR CLEANING VIA OPENINGS IN INTEGRATED CIRCUIT MANUFACTURING

FIELD OF THE INVENTION

The invention relates to the field of semiconductor processing, and, more particularly, to a method for cleaning via openings.

BACKGROUND OF THE INVENTION

Integrated circuits are used in many electronic devices, such as cellular telephones, personal computers, radios, televisions, etc. A typical integrated circuit includes a plurality of active semiconductor device regions formed in a substrate of semiconductor material. Two or more metal interconnect layers are used to connect various portions of the integrated circuit. Adjacent metal interconnect layers are separated by one or more dielectric or insulating layers. Typically an electrical connection or contact is established between adjacent vertical portions of two different metal interconnect layers.

Such a vertical electrical connection is conventionally made by forming a via opening in a dielectric layer thereby exposing a portion of the underlying metal interconnect layer. This via opening is typically cleaned and filled with conductive material to form the vertically extending conductor or contact. One or more barrier metal layers may be formed to first line the via opening before filling the rest of the opening.

As discussed, for example, in U.S. Pat. No. 5,451,543 to Woo et al., as semiconductor device dimensions continue to be reduced, one limiting factor remains the area required for device interconnections. The use of multilevel metallizations partially address this difficultly. However, the area available for via openings is also being reduced and the electrical resistance posed by smaller resulting contacts creates difficulties in further reducing dimensions. During a typical via etching process, the etching tends to create metal oxide, such as, for example, aluminum oxide, which becomes deposited on the sidewall of the via opening. This causes a tapering of the via opening such that the bottom portion is much smaller in area than the top portion. An organic solvent has been used to remove the residue of aluminum oxide from the via sidewalls. Unfortunately, the use of the solvent also attacks the exposed aluminum and may result in poor coverage of a subsequent barrier layer.

U.S. Pat. No. 5,661,083 to Chen et al. discloses an approach to removing such sidewall and bottom residue in a via opening wherein a portion of an etch stop layer is removed using a reactive ion etch and downstream microwave ash system under conditions effective to create a substantially water-soluble polymer residue within the via. The water-soluble polymer is then removed to expose the underlying metal layer.

Despite advances in creating via openings with smaller dimensions and more consistent dimensions from top to bottom, there still exists a need to improve techniques as feature sizes continue to be reduced. Problems continue to exist with redeposition of metal oxides on the via sidewalls. The copper oxide layer should be effectively removed from the bottom of the via opening to form a low resistance electrical contact in the via opening.

SUMMARY OF THE INVENTION

In view of the foregoing background, it is therefore an object of the invention to provide a method for cleaning via openings that will provide for a lower contact resistance while permitting a high density of interconnections as semiconductor feature sizes continue to be decreased.

This and other objects, features and advantages in accordance with the present invention are provided by a method for cleaning a via opening of an integrated circuit, the via opening including sidewalls and an exposed metal portion at a bottom thereof. By efficiently cleaning the via opening the contact resistance is lowered. The method preferably comprises the steps of sputter cleaning the via opening at least once, and exposing the via opening to a reducing atmosphere at least once. The method may include alternatingly repeating the sputter cleaning and exposing steps. In some embodiments, the step of sputter cleaning is preferably performed prior to the step of exposing, and a sputter cleaning may be performed after a last step of exposing the via opening to the reducing atmosphere.

In one embodiment of the invention, the exposed metal portion comprises a metal compound, such as a metal oxide, oxi-nitride, sulfide or mixtures thereof. Accordingly, the step of sputter cleaning removes at least a portion of the metal compound, and the step of exposing preferably comprises reducing at least a portion of the metal compound. The invention is particularly applicable when the metal interconnection layer is a copper, as copper readily oxides at its exposed surface.

In accordance with another advantageous feature of the invention, the use of both sputter cleaning and exposure to the reducing atmosphere provides for upper corners of the via opening to have a predetermined amount of bevel. For example, if sputter cleaning alone were used, the upper edges of the sidewalls of the via opening would likely be beveled too severely, and the ability to maintain a high interconnect density would be sacrificed. According to the present invention, the combination of both sputter cleaning and exposure to the reducing atmosphere removes the residue from the sidewalls of the via opening and removes the metal compound from the exposed metal layer, while maintaining a desired degree of beveling of the upper corners of the via opening.

The step of sputter cleaning preferably comprises performing a plasma assisted sputtering, such as using argon, for example. The step of exposing may comprise exposing the via opening to a reducing ion/neutral treatment, that is, to treatments other than oxidation. For example, the reactive ion treatment may include exposing the via opening to a hydrogen containing plasma. Alternatively, the step of exposing the via opening to a reducing atmosphere may comprise exposing the via opening to an ammonia gas dissociated by an elevated temperature or a plasma. Another advantageous feature of the invention is that the sputter cleaning and reducing steps may be performed in one processing chamber.

Another method aspect of the invention is for making an integrated circuit incorporating the method of cleaning via openings discussed above. The integrated circuit thus produced enjoys low contact resistance, and because the beveling of the upper corners of the via openings can be accurately controlled, the pitch or density of interconnects can be relatively high.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The thicknesses of certain regions and layers is exaggerated for ease of understanding.

Figure 1:
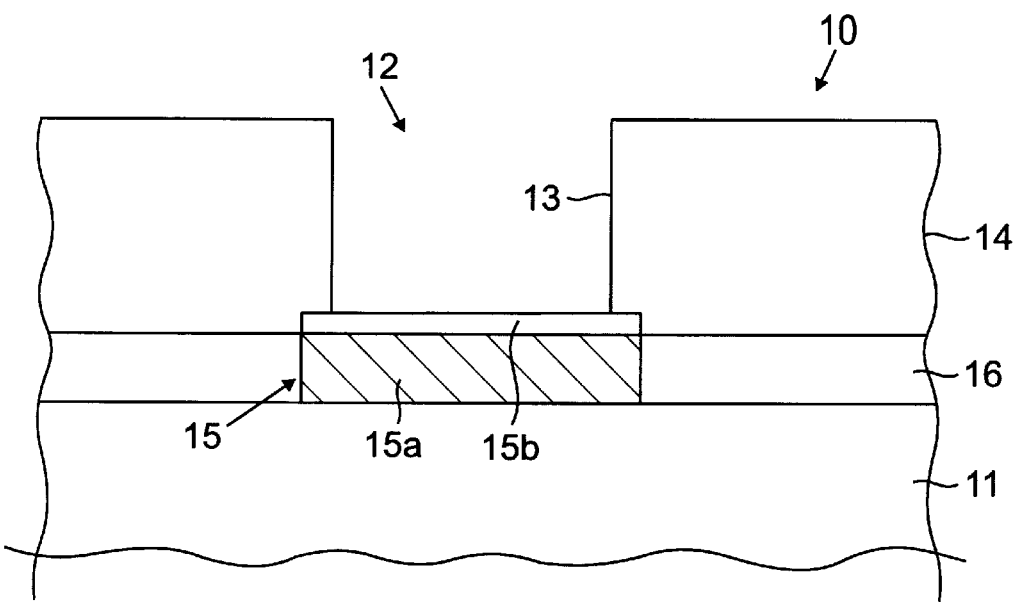
FIG. 1 is a schematic cross-sectional view of a portion of an integrated circuit including a via opening formed therein to be cleaned and further processed in accordance with the present invention.

The method in accordance with the present invention will now be explained with reference to the series of schematic cross-sectional drawing FIGS. 1–4. As shown in FIG. 1, the method is applicable to an integrated circuit 10, only a portion of which is shown. In particular, the portion illustrated includes only a single via opening 12 which extends vertically from the upper surface of the uppermost dielectric layer 14 downward to an underlying portion of a metallic interconnect layer 15. The via opening 12 includes substantially vertically extending sidewalls 13 which terminate at the bottom onto the exposed portion of the metal layer 15. In other embodiments of the invention, layers which serve as etch stop layers during formation of the via opening may also be present. For ease of understanding the cleaning process of the present invention, the etch stop layers are not further discussed herein.

In the illustrated embodiment another dielectric layer 16 is also positioned between the uppermost dielectric 14 and the semiconductor substrate 11. Those of skill in the art will readily appreciate the method in accordance with the present invention can be used for via openings between any metal layers in a typical integrated circuit, not just between a first and second metal interconnect layer as will be described in detail herein for simplicity of understanding.

Referring now particularly to FIG. 1, the metal layer 15 illustratively includes a surface metal compound portion 15b overlying the metal portion 15a. As will be readily appreciated by those skilled in the art, the metal layer 15 may be any of a number of metals and/or metal alloys commonly used for interconnections in integrated circuit manufacturing. For example, the metal layer 15 may be copper, tungsten, silver, nickel, molybdenum, gold, chromium or alloys of these metals. In addition, although only a single layer and its surface compound portion are illustrated, the method of the invention is applicable to multilayer conductor structures. The invention is particularly beneficial for a copper metal layer 15 as copper readily forms an oxide surface coating. The metal compound portion 15b on the metal layer 15 may be an oxide, oxi-nitride, sulfide, and/or mixtures thereof as will be readily appreciated by those skilled in the art.

Although not shown by discrete regions in FIG. 1, after etching to form the via opening 12, the sidewalls 13 of the via opening are likely to include residue materials thereon. These residues can reduce the cross-sectional dimensions of the via opening, and thereby ultimately increase the contact resistance and also increase sidewall capacitance. In addition, such residues can reduce the ability of a subsequent barrier metal layer to adhere to the sidewalls.

To remove the residues, argon sputtering may be used, for example, to mechanically remove the residues. The argon sputtering also causes a rounding or beveling of the upper corners of the via opening 12. Unfortunately, to remove the residues and remove the oxide layer 15b with argon sputtering alone would cause an excessive beveling of the corners, such that the tapering of the via opening would be too severe at the bottom end of the via opening. Accordingly, resolution of the line spacings and widths in the next metal layer would need to be sacrificed. The present invention addresses the inadequacies of the prior art to maintain a desired profile of the via opening 12 while efficiently removing the metal compound layer 15b to ensure a low resistance contact with the underlying metal portion 15a.

Figure 2:
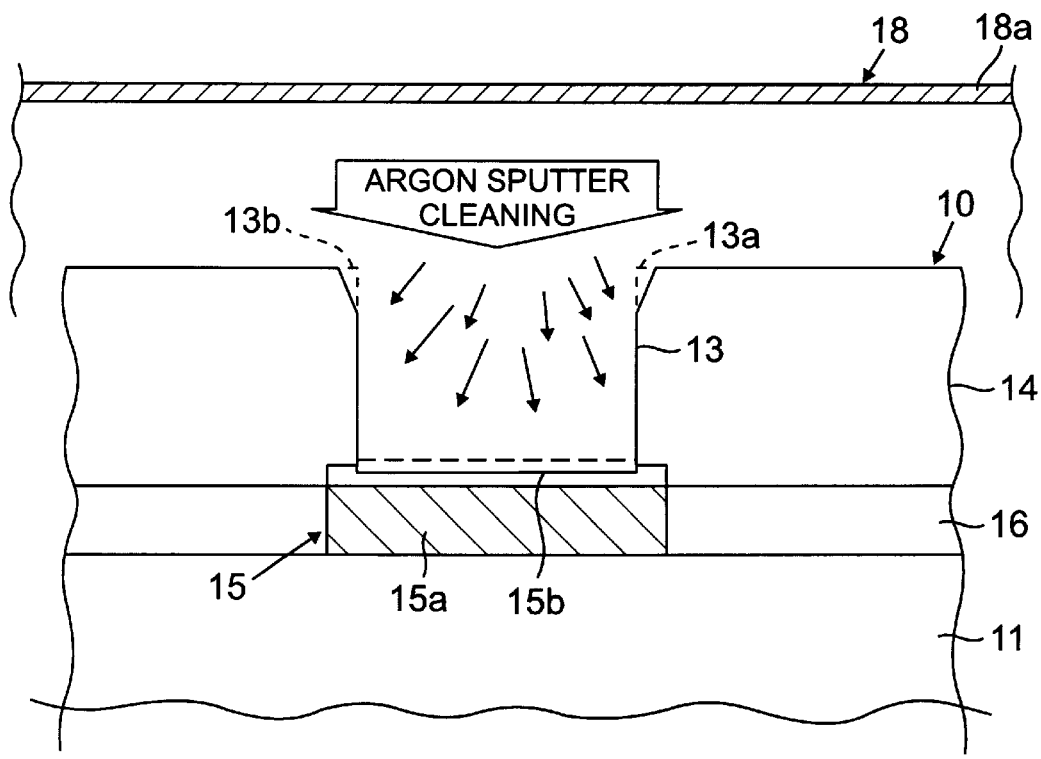
FIG. 2 is a schematic cross-sectional view of a portion of the integrated circuit as shown in FIG. 1 and illustrating an initial sputter cleaning of the via opening in accordance with the method of the present invention.

Referring now additionally to FIG. 2, the first sputter cleaning step in accordance with the method of the present invention is now explained. The sputter cleaning may be an argon sputter cleaning as will be appreciated by those skilled in the art. Those of skill in the art will recognize that other chemical specie may be used in lieu of or in addition to argon. For example, another inert gas, inert-like gas (nitrogen), and/or mixtures thereof may be used. This sputter cleaning is preferably not a reactive ion etch, for example, as will be understood by those skilled in the art. The sputter cleaning is an anisotropic etching procedure that removes surface material by momentum transfer as will also be readily appreciated by those skilled in the art.

The argon sputter cleaning is preferably carried out across the entire surface of the semiconductor wafer being processed. The sputter cleaning may be carried out in a conventional processing chamber 18, a top wall portion 18a of which is schematically illustrated. The chamber 18 may be kept at a pressure in a range of about 0.5 to 4 milliTorr, and the temperature be in a range of about room temperature up to 400° C., for example. Those of skill in the art will recognize that other processing conditions are also possible and contemplated by the present invention.

The sputter cleaning removes or bevels a portion of the upper corners 13a, 13b as schematically illustrated, wherein the dashed lines indicate the prior extent of the corners. In addition, the sputter cleaning also removes a portion of the metal compound layer 15b as again illustrated by the dashed line which represents the starting height of the metal compound layer. Although material, including the undesired residue, is also removed from the sidewalls 13, for clarity of explanation this is not illustrated although it will be readily understood and appreciated by those skilled in the art.

The initial sputter cleaning can be stopped prior to complete removal of the metal compound layer 15b. Accordingly, the bevel of the upper corners 13a, 13b can be controlled or maintained as desired. Of course, some bevel is needed to ensure that the later added barrier metal layer can cover the corners without introducing voids or missing coverage as will be appreciated by those skilled in the art.

Figure 3A:
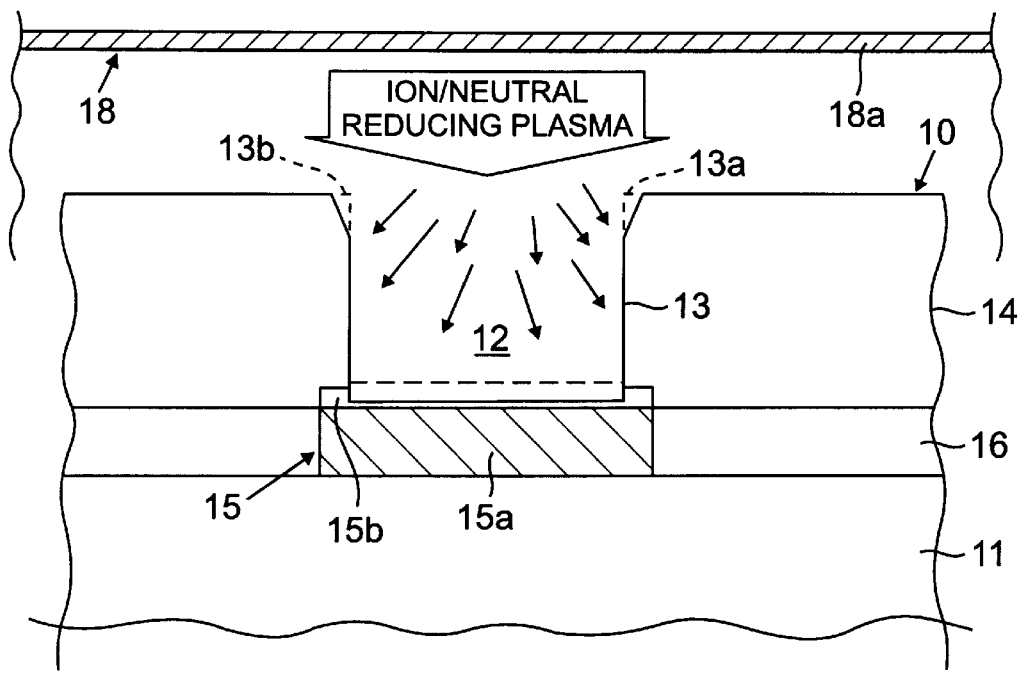
FIG. 3A is schematic cross-sectional view of the integrated circuit portion as shown in FIG. 1 after the initial sputter cleaning step and during exposure to a reducing atmosphere of a hydrogen plasma in accordance with one embodiment of the invention.

Referring now additionally to FIG. 3A one embodiment of a step of exposing the via opening 12 to a reducing atmosphere in accordance with the invention is now described. In this embodiment or variation, a hydrogen containing plasma is created within the processing chamber 18 and therefore reduces remaining portions of the metal compound layer 15b. This chemical reduction also causes a volumetric reduction in the metal compound layer 15b. In addition, this exposure to the reducing atmosphere also reduces any metal compound that may have become redeposited onto the sidewalls 12 by the initial via etching or previous sputter cleaning step as will be appreciated by those skilled in the art. The conditions for achieving a suitable hydrogen containing plasma within a conventional reaction chamber 18 sufficient for the reduction of the metal compound will be readily understood by those skilled in the art without requiring further discussion herein.

It is theorized without applicants wishing to be bound thereto that the exposure to the reducing atmosphere may create certain hydrides at the surface of the metal compound layer 15b which facilitate later removal by a subsequent sputter cleaning. The reducing does not attack or remove the corners 13a, 13b or other portions of the via opening as aggressively as does the argon sputtering. However, applicants also believe that the exposure to the reducing atmosphere alone is not sufficient to fully remove the residue from the sidewalls 13, or to fully remove the metal compound layer 15b.

Figure 3B:
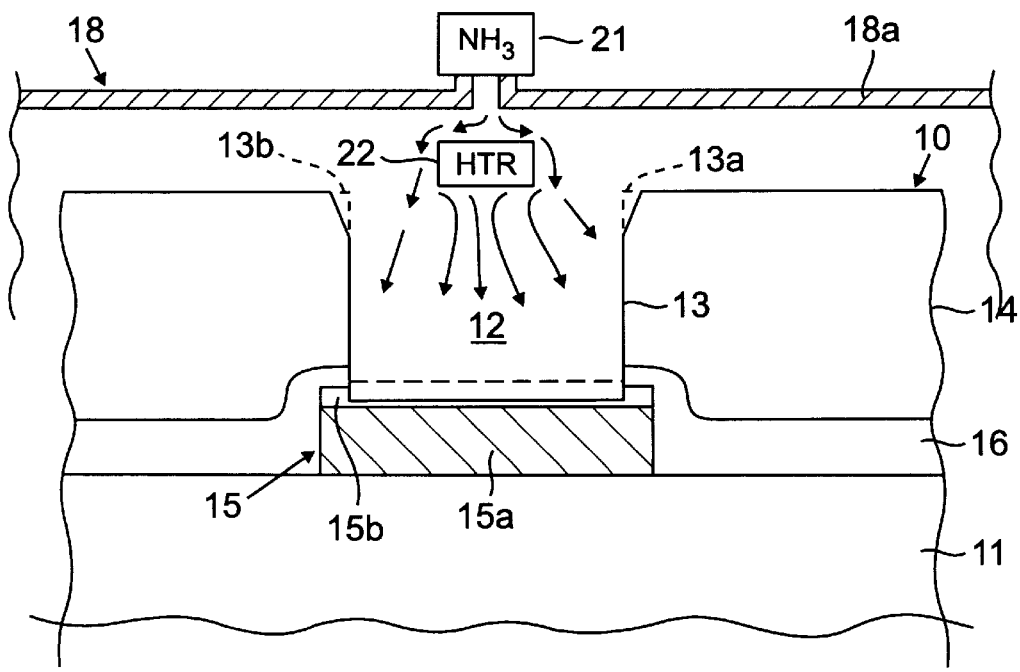
FIG. 3B is a schematic cross-sectional view of the integrated circuit portion as shown in FIG. 1 after the initial sputter cleaning and during exposure to a reducing atmosphere of dissociated ammonia in accordance with another embodiment of the invention.

Turning now briefly to FIG. 3B, an alternative approach to exposing the via opening 12 to the reducing atmosphere is explained. In this embodiment or variation, ammonia gas ($NH_3$) is supplied to the interior of the processing chamber 18 from an external gas ammonia source 21. A heater coil 22 is positioned within the chamber 18 to heat and dissociate the ammonia to thereby expose the via opening 12 to the reducing atmosphere as will be readily appreciated by those skilled in the art. An external heat source may also be used in lieu of or in addition to the illustrated heater coil 22. Those of skill in the art will also appreciate other equivalent approaches for exposing the via opening 12 to a reducing atmosphere.

Figure 4:
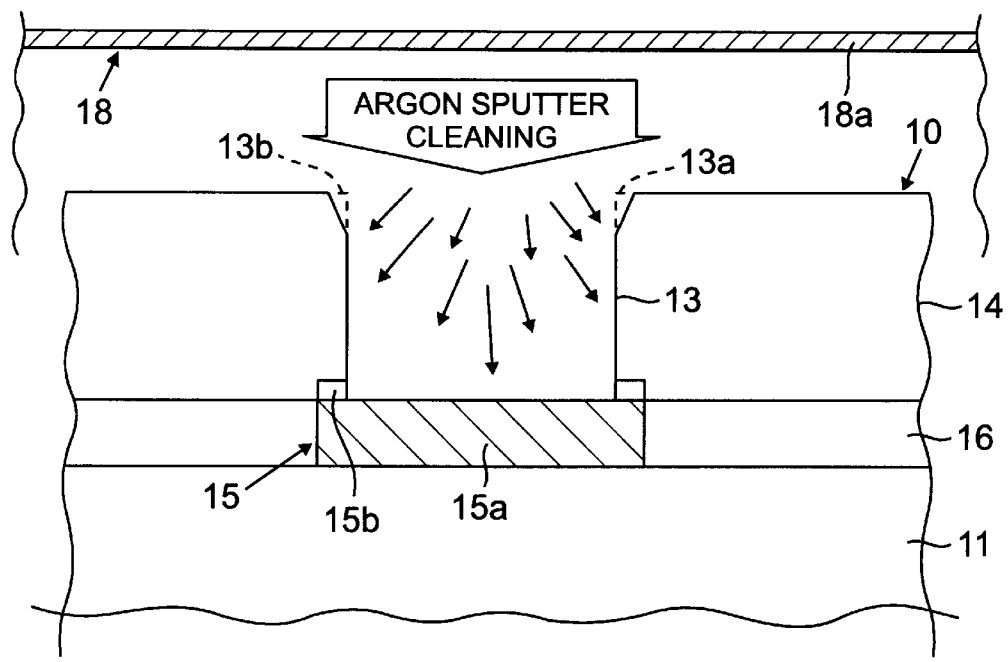
FIG. 4 is a schematic cross-sectional view of the integrated circuit portion as shown in FIG. 1 illustrating a second sputter cleaning step in accordance with the present invention.

Referring now additionally to FIG. 4, the last argon sputter cleaning is illustrated. In this final sputter cleaning, the remaining metal compound portion and residue from the sidewalls are removed. A further beveling of the corners 13a, 13b is also schematically illustrated as will occur with this argon sputter cleaning. However, because of the intervening step of exposing the via opening 12 to the reducing atmosphere, the overall amount of beveling is reduced from that which would be required if only sputter cleaning were used to remove the metal compound portion 15b and sidewall residue. Accordingly, the present invention cleans the via opening 12 to permit good electrical contact with the metal layer 15. The upper portion of the opening is also sufficiently sized and shaped to permit the formation of the barrier layer and plug filling of the via opening 12.

In the illustrated embodiment, first and third steps of argon sputter cleaning, with an intervening exposure to a reducing atmosphere have been described. In some embodiments only one sputter cleaning step and only one exposure to the reducing atmosphere may be required. In certain embodiments, the order of these steps can be reversed. In addition, in other typical applications, the sputter cleaning and exposure to the reducing atmosphere may be alternatingly repeated until the sidewall residue and metal compound layer 15b are removed.

Another advantage of the present invention is that the sputter cleaning and exposure to the reducing atmosphere steps can be performed with the semiconductor wafer remaining in one processing chamber 18. Those of skill in the art will recognize that a cryopump may be used to extract the argon from the chamber 18 after the sputter cleaning step, and a turbopump may be substituted for the cryopump or used in conjunction with the cryopump to extract the hydrogen from the chamber 18 after the exposure to the reducing atmosphere.

Figure 5:
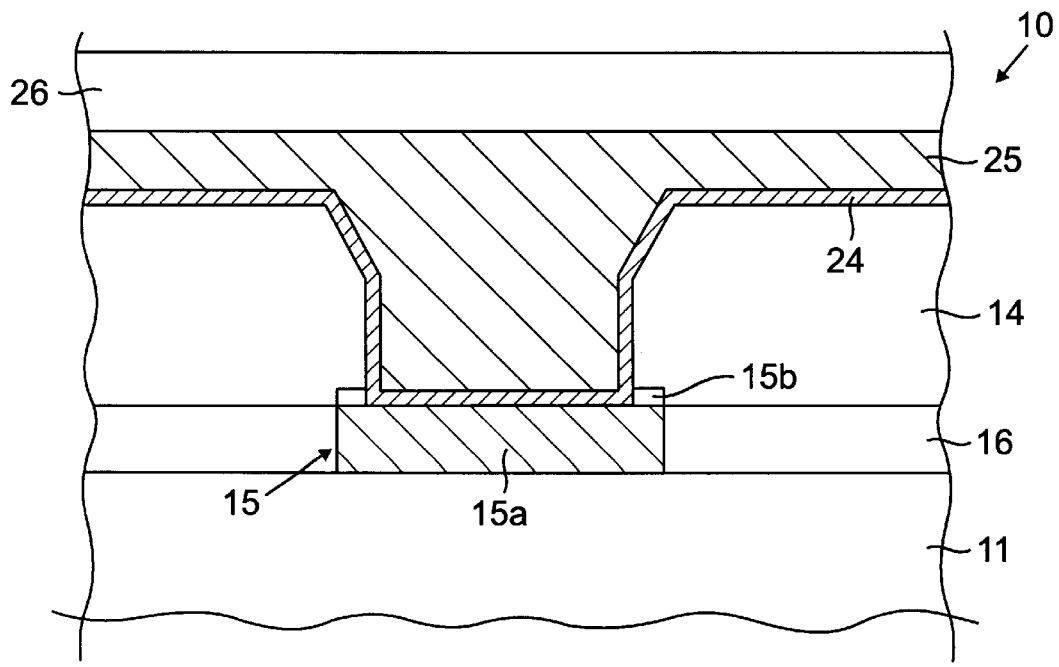
FIG. 5 is a schematic cross-section view of the integrated circuit portion as shown in FIG. 1 illustrating the filling of the via opening and subsequent formation of a second metal interconnect layer after the via opening cleaning in accordance with the present invention.

One example of a portion of the integrated circuit 10 including two metal interconnect layers and wherein the above explained via opening cleaning method has been used, is explained with reference to the simplified schematic cross-sectional diagram of FIG. 5. A barrier layer 24 has been applied to cover the via opening and adjacent upper portions of the dielectric layer 14. The recess defined in the via opening by the barrier layer 24 is filled with a conductive plug 25 of material that is also part of an upper interconnection layer Those skilled in the art will recognize a wide variety of materials suitable for the barrier layer 24 and metal layer 25 Conductor filled via openings produced according to the present invention may interconnect adjacent metal levels of integrated circuits including three or more metal levels, and may connect metal layers spaced from one another by one or more intervening metal layers as will also be appreciated by those skilled in the art. The conductor filled vias may also connect to landed or unlanded contact areas of the interconnect metal layers as will also be appreciated by those skilled in the art.

In other embodiments of the integrated circuit 10, a barrier layer 24 may not be needed, while in other embodiments, a multilayer barrier structure may be preferred. As will also be understood by those skilled in the art, the plug of material filling the recess in the via opening may be different from the material of the rest of the interconnection layer. The integrated circuit 10 may also include an overall passivation layer 26. All such embodiments and variations of the integrated circuit 10 are believed to significantly benefit from the cleaning approach for the via opening as described herein. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for cleaning a via opening of an integrated circuit, the via opening including sidewalls and an exposed metal portion at a bottom thereof, the method comprising the steps of:

sputter cleaning the via opening at least once; and exposing the via opening to a reducing atmosphere at least once.

2. A method according to claim 1 further comprising alternatingly repeating the sputter cleaning and exposing steps.

3. A method according to claim 1 wherein a step of sputter cleaning is performed prior to the step of exposing.

4. A method according to claim 1 wherein the exposed metal portion comprises a metal compound; wherein the step of sputter cleaning removes at least a portion of the metal compound; and wherein the step of exposing comprises reducing at least a portion of the metal compound.

5. A method according to claim 4 wherein the metal compound comprises at least one of a metal oxide, metal oxi-nitride, metal sulfide, and mixtures thereof.

6. A method according to claim 1 wherein the step of sputter cleaning comprises sputter cleaning sufficiently to bevel edges on upper corners of the via opening.

7. A method according to claim 1 wherein the step of sputter cleaning at least once comprises sputter cleaning the via opening after a last step of exposing the via opening to the reducing atmosphere.

8. A method according to claim 1 wherein the step of sputter cleaning comprises performing a plasma assisted sputtering.

9. A method according to claim 1 wherein the step of sputter cleaning comprises sputter cleaning with an inert material.

10. A method according to claim 1 wherein the step of exposing comprises exposing the via opening to a reducing ion/neutral treatment.

11. A method according to claim 10 wherein the step of exposing the via opening to the reducing ion/neutral treatment comprises exposing the via opening to a hydrogen containing plasma.

12. A method according to claim 1 wherein the step of exposing comprises exposing the via opening to a dissociated ammonia gas.

13. A method according to claim 1 wherein the steps of sputter cleaning and exposing are performed in one processing chamber.

14. A method for cleaning a via opening of an integrated circuit, the via opening including sidewalls with residue thereon and an exposed metal portion having a metal compound thereon at a bottom of the via opening, the method comprising the steps of:
 sputter cleaning the via opening a plurality of times, and exposing the via opening to a reducing atmosphere between sputter cleaning steps to thereby form beveled edges on upper corners of the via opening, remove residue from the sidewalls and remove metal compound from the exposed metal portion.

15. A method according to claim 14 wherein the metal compound comprises at least one of a metal oxide, a metal oxi-nitride, a metal sulfide, and mixtures thereof.

16. A method according to claim 14 wherein the step of sputter cleaning comprises performing a plasma assisted sputtering.

17. A method according to claim 14 wherein the step of sputter cleaning comprises sputter cleaning with an inert material.

18. A method according to claim 14 wherein the step of exposing comprises exposing the via opening to a reducing ion/neutral treatment.

19. A method according to claim 18 wherein the step of exposing the via opening to the reducing ion/neutral treatment comprises exposing the via opening to a hydrogen containing plasma.

20. A method according to claim 14 wherein the step of exposing comprises exposing the via opening to a dissociated ammonia gas.

21. A method according to claim 14 wherein the steps of sputter cleaning and exposing are performed in one processing chamber.

22. A method for making an integrated circuit comprising a semiconductor substrate and at least two vertically separated metal layers electrically connected together adjacent the semiconductor substrate, the method comprising the steps of:
 forming a first metal layer adjacent the semiconductor substrate;
 forming at least one dielectric layer on the first metal layer;
 forming at least one via opening extending through the at least one dielectric layer to the first metal layer;
 cleaning the at least one via opening by sputter cleaning the at least one via opening at least once, and exposing the at least one via opening to a reducing atmosphere at least once;
 forming a conductive plug filling the at least one cleaned via opening; and
 forming a second metal layer on the at least one dielectric layer and connected to the conductive plug.

23. A method according to claim 22 wherein the step of forming the conductive plug comprises the steps of:
 forming a barrier layer lining the at least one via opening and leaving a recess in the via opening; and
 filling the recess with a conductive material.

24. A method according to claim 22 further comprising alternatingly repeating the sputter cleaning and exposing steps.

25. A method according to claim 22 wherein the exposed metal portion comprises a metal compound;
 wherein the step of sputter cleaning removes at least a portion of the metal compound; and wherein the step of exposing comprises reducing at least a portion of the metal compound.

26. A method according to claim 25 wherein the metal compound comprises at least one of a metal oxide, a metal oxi-nitride, a metal sulfide, and mixtures thereof.

27. A method according to claim 22 wherein the step of sputter cleaning comprises performing a plasma assisted sputtering.

28. A method according to claim 22 wherein the step of sputter cleaning comprises sputter cleaning with an inert material.

29. A method according to claim 22 wherein the step of exposing comprises exposing the via opening to a reducing ion/neutral treatment.

30. A method according to claim 29 wherein the step of exposing the via opening to the reducing ion/neutral treatment comprises exposing the via opening to a hydrogen containing plasma.

31. A method according to claim 22 wherein the step of exposing comprises exposing the via opening to a dissociated ammonia gas.

32. A method according to claim 31 wherein the steps of sputter cleaning and exposing are performed in one processing chamber.

* * * * *